United States Patent [19]

Dalqvist et al.

[11] Patent Number: 4,750,146

[45] Date of Patent: Jun. 7, 1988

[54] METHOD AND APPARATUS FOR COMPENSATING FOR THE TRUNCATION ERROR IN A FILTERED SIGNAL BY ADDING THE ERROR TO THE POSITIVE PART OF THE SIGNAL AND SUBTRACTING THE ERROR FROM THE NEGATIVE PART OF THE SIGNAL

[75] Inventors: Ingemar E. Dalqvist, Johanneshov; Gunnar A. Eriksson, Huddinge, both of Sweden

[73] Assignee: Telefonaktiebolaget LM Ericsson, Stockholm, Sweden

[21] Appl. No.: 755,379

[22] PCT Filed: Oct. 31, 1984

[86] PCT No.: PCT/SE84/00367

§ 371 Date: Jun. 25, 1985

§ 102(e) Date: Jun. 25, 1985

[87] PCT Pub. No.: WO85/02508

PCT Pub. Date: Jun. 6, 1985

[30] Foreign Application Priority Data

Nov. 24, 1983 [SE] Sweden .............................. 8306483

[51] Int. Cl.$^4$ .............................................. G06F 7/38
[52] U.S. Cl. ....................................... 364/745; 364/724
[58] Field of Search ............... 364/745, 724, 736, 768; 375/26

[56] References Cited

U.S. PATENT DOCUMENTS

| | | | |
|---|---|---|---|
| 3,891,837 | 6/1975 | Sunstein | 364/745 |
| 4,195,350 | 3/1980 | Moore | 364/724 |
| 4,282,581 | 8/1981 | Bondurant et al. | 364/737 |
| 4,589,084 | 5/1986 | Fling et al. | 364/745 |

FOREIGN PATENT DOCUMENTS 2064243  11/1979  United Kingdom .

OTHER PUBLICATIONS

R. Kieburtz, "Rounding and Truncation Limit Cycles in a Recursive Digital Filter," IEEE Trans on Acoustics, Speech, and Signal Processing, Feb. 1974, p. 73.

B. Gold et al, "Digital Processing of Signal", McGraw-Hill Book Company, N.Y., 1969, pp. 98–131.

Primary Examiner—Gary V. Harkcom
Assistant Examiner—Tan V. Mai
Attorney, Agent, or Firm—Roberts, Spiecens & Cohen

[57] ABSTRACT

A method and device for compensating the truncation error occurring in a sampled signal during processing in a digital filter. The mean error $e_t$ is calculated for the filter, and before filtering the signal $+e_t$ is added if the signal is positive and $-e_t$ is added if the signal is negative.

4 Claims, 3 Drawing Sheets

METHOD AND APPARATUS FOR COMPENSATING FOR THE TRUNCATION ERROR IN A FILTERED SIGNAL BY ADDING THE ERROR TO THE POSITIVE PART OF THE SIGNAL AND SUBTRACTING THE ERROR FROM THE NEGATIVE PART OF THE SIGNAL

FIELD OF THE INVENTION

The present invention relates to a method and apparatus for compensating for the error which occurs when a sampled signal with a given number of bits, e.g. 16 bits, is truncated to a lower value after multiplication. Such an operation is generally performed in a digital filter.

BACKGROUND

In a digital filter, particurlarly one included in a subscriber line audio processing circuit (SLAC), calculations are carried out on a sampled signal. Each signal sample is represented as a digital word in linear code. The number of bits/word depends on the dynamic range required by the filter.

Multiplications with digital coefficients are performed in the filter. The result of a multiplication normally contains more bits than the available word length, and the result must therefore be rounded off or truncated. By rounding off the digital value is given a new value above or below the original value, according to the same rules as those for rounding off decimals. By truncation, there is intended magnitude truncation, i.e. the digital value is given a new value, the amount of which is always below the magnitude of the original value (truncation towards zero).

If rounding off is used there is a risk of self-oscillation in the digital filter if this is of the infinite impulse response type, i.e. a filter where the signal is fed back.

If magnitude truncation is used, the filter can be constructed so that the risk of self-oscillation is removed, since the digital values are continually rounded off towards zero. Truncation is furthermore easier to realize than rounding off. However, with magnitude truncation the signal will always be somewhat too small, due to truncation errors and in the calculations. This particularly affects low signal levels where the truncation error is not negligible compared with the signal amplitude. In the accompanying drawing, FIG. 1 illustrates an analog signal 1 which, for example, is sinusoidal. It has been sampled to give the sample values $s_1, s_2 \ldots$, which constitute the input signal to a digital filter. The output signal from the filter is illustrated in FIG. 2. Apart from the desired changes in the signal caused by filtering, the sample values $s_1 s_2 \ldots$ have been given a somewhat lower value that that of the nominal signal 1 due to truncations in the filter. The (dashed) analog signal 2 corresponding to the truncated sample values $s_1 s_2 \ldots$ is thus less than the signal 1.

It is previously known to increase the number of bits/word so that the effect of truncation errors will be as small as possible. Many bits/word result in a more complicated circuit, however, since registers, stores and calculating units, i.e. arithmetic logic units (ALU), must be made large. FIG. 3 illustrates the amplification A in a filter as a function of the signal level. The number of bits/word (16, 17, 18 or 19 bits/word) has been given as a parameter.

SUMMARY OF THE INVENTION

The object of the present invention is to provide a method and a device which will compensate the error occurring in the truncation of a digital signal having a given number of bits/word, the signal being processed in a digital filter.

In accordance with the invention, the mean truncation error for the filter which processes the signal is calculated and, this error is added to the positive input sample of the filter, and subtracted from the negative input samples. By means truncation error is meant the average of the truncation errors which are produced by the multiplications in the digital filter multipliers included in the subscriber audio-processing circuits. This average error can be calculated in the arithmetic-logic unit in a manner known per se.

BRIEF DESCRIPTION OF THE FIGURES OF THE DRAWINGS

The invention will now be described in detail with reference to the accompanying drawings.

DETAILED DESCRIPTION OF BEST MODES FOR CARRYING OUT THE INVENTION

Figure 1:
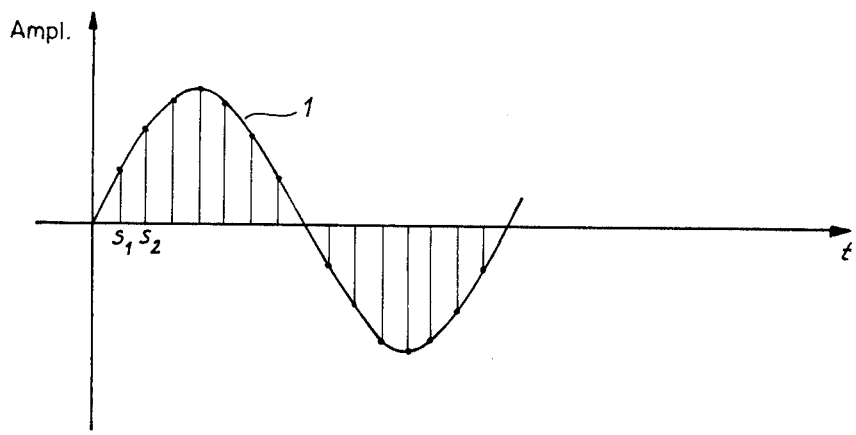
FIGS. 1 and 2 are diagrams of a sinusoidal, sampled signal before and after truncation in a digital filter.
Figure 2:
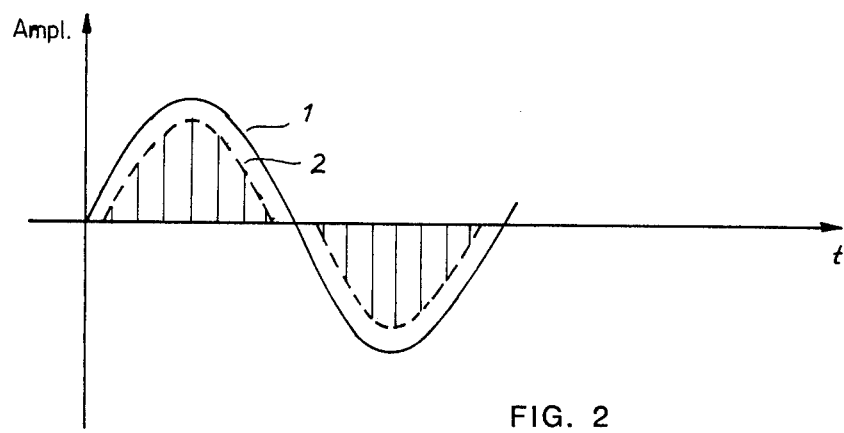
Figure 3:
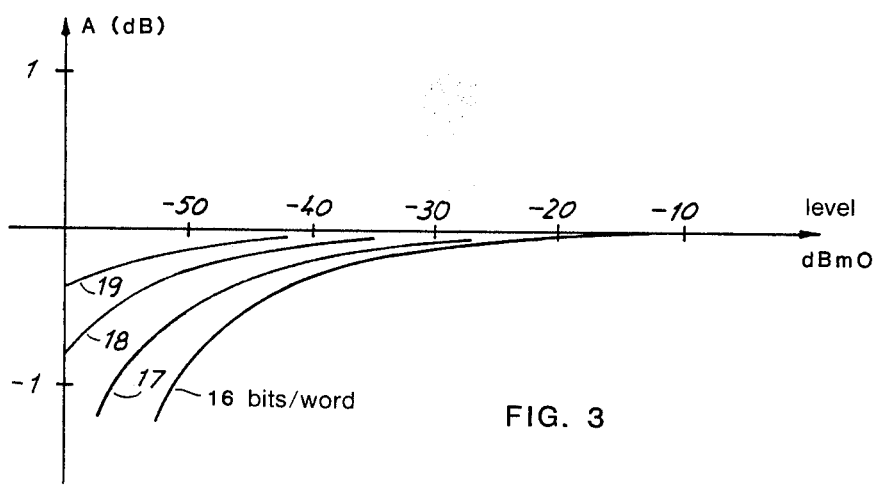
FIG. 3 illustrates the amplification in a digital filter as a function of the input signal level for different word lengths.
Figure 4:
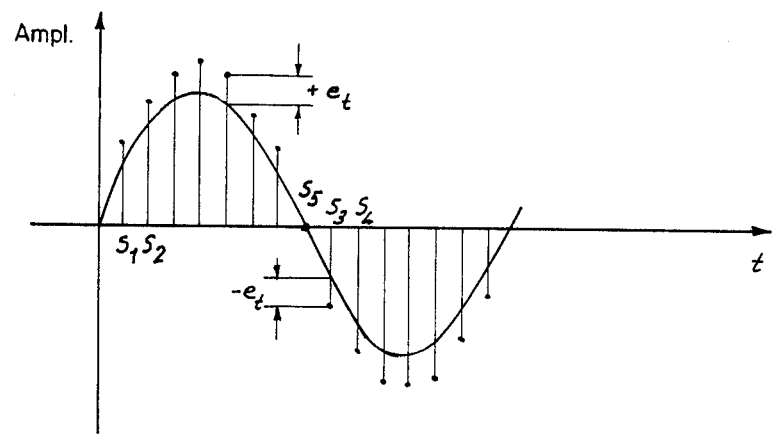
FIGS. 4 and 5 are diagrams corresponding to the diagrams in FIGS. 1 and 2 and are intended to illustrate the method in accordance with the invention.
Figure 5:
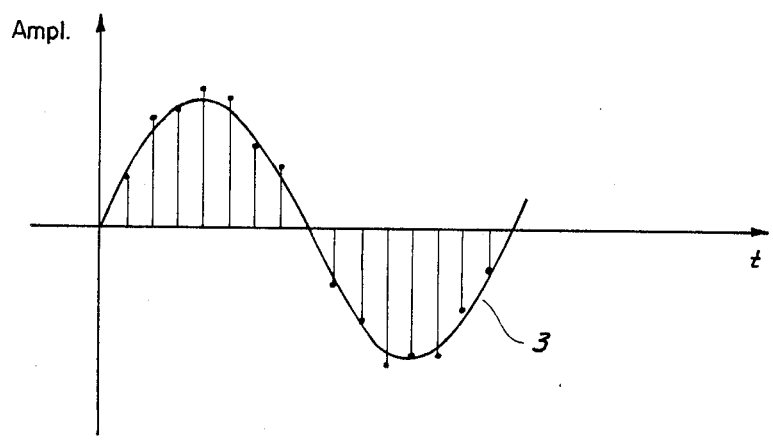

FIGS. 1, 2 and 3 have been explained hereinbefore in conjunction with the background art. FIG. 4 is a time chart illustrating how, in accordance with the inventive method, an amount $+e_t$ is added to the positive signal samples $s_1, s_2 \ldots$ and a negative amount $-e_t$ is added to the negative signal samples $s_3, s_4 \ldots$. No correction is added to the signal sample $s_5$ which is zero. FIG. 5 is a diagram of the output signal from the digital filter. Since the correction $e_t$ has been selected equal to the mean truncation error, the output signal samples follow on an average the desired nominal output signal 3.

Figure 6:
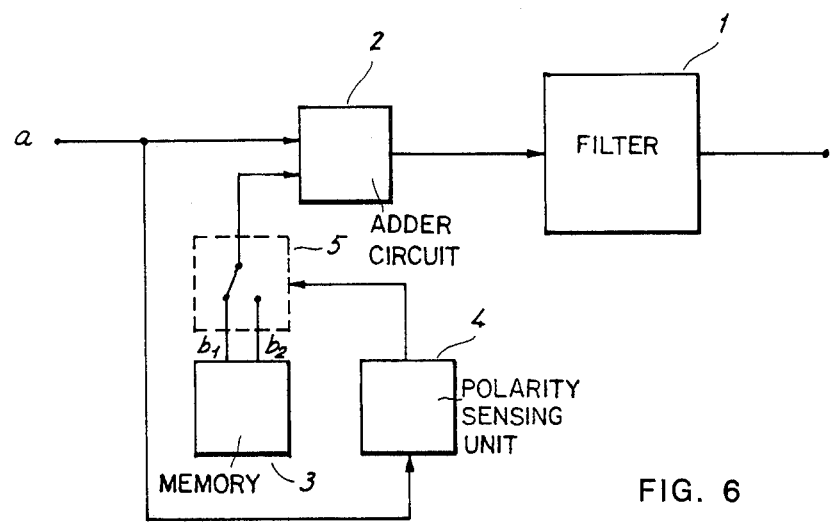
FIG. 6 is a block diagram of a device for carrying out the method in accordance with the invention.
Figure 7:
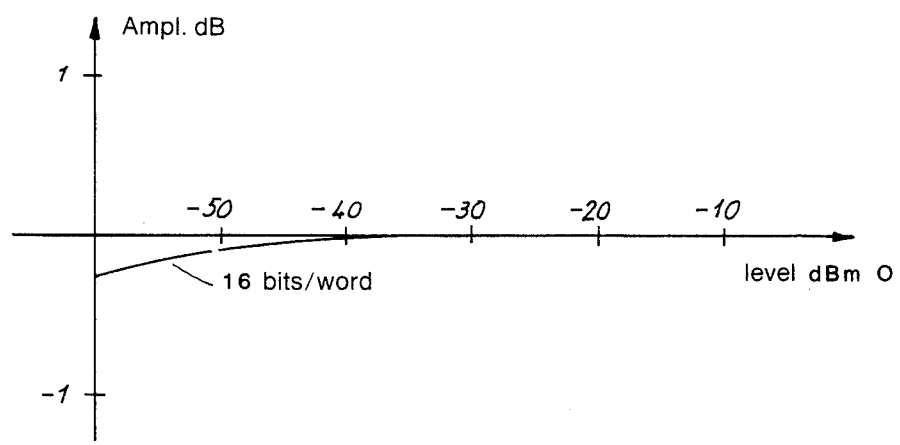
FIG. 7 is the same diagram as in FIG. 3, but the inventive method has now been used on the filter input signal.

FIG. 6 is a block diagram of an embodiment of a device included in a subscriber line audio processing circuit (SLAC), for example, and carries out the method according to the invention. A sampled signal is obtained at the input a, this signal not yet having been processed in any digital filter and is not truncated. This signal is to be taken to a main transmission filter 1 for filtering as is described in the patent application No. PCT/US80/00754, for example. The input a is connected to the first input of a digital adder circuit 2 and a digital sensing unit 4, which conventionally senses the polarity of the incoming signal at the input a. The block 3 is illustrated here as a simple memory unit, which stores the $+e_t$ and $-e_t$ in digital form, the value $+e_t$ being obtained at the output $b_1$ and the value $-e_t$ at the output $b_2$. Since the values $\pm e_t$ are generally represented by more than one bit, $b_1$ and $b_2$ represent the output from two bus lines. The block 5 is a controllable switch, e.g. a multiplexer, which connects the output $b_1$ or $b_2$ to the second input of the adder circuit 2 in response to the output magnitude (0 or 1) obtained at the output of the sensing unit 4. If unit 4 senses positive polarity in the input signal at the input a, a binary "one" is sent to the switch 5 and this connects the output $b_1$ to the second input of the adder circuit 2. On the other hand, if a negative polarity is sensed, a binary "zero" is sent and the switch is controlled so that the output $b_2$ is connected to the second input to the adder circuit. A value $+e_t$ is thus added to the incoming sampled signal, which is then taken to the digital filter 1. A calculation is performed in the filter with the aid of multipliers and adding circuits and truncations are carried out, an output signal being obtained having a signal sample illustrated in FIG. 5, as well as the resulting analog counterpart, curve 3. FIG. 7 is a diagram of the filter amplification as a function of the input signal level, when the compensating circuit according to FIG. 6 is connected such as to precede the filter. In comparison with the amplification according to FIG. 3, it will be seen that the same amplification properties are achieved with 16 bits/word in the latter case with the inventive method as if about 19 bits/word were used without the inventive method. The improvement in the amplification linearity thus corresponds to a word length of several bits, and according to the above this gives simpler calculating circuits.

The compensating circuit according to FIG. 6 is illustrated in the form of a block diagram for the purpose of explanation and constitutes one embodiment. In practice, the various blocks (memory unit, adding circuit, switches) are realized with IC technique in the arithmetical unit ALU of the subscriber line circuit.

In order that compensation for the truncation error may be kept simple, the magnitude $e_t$ should be an integral number in the ALU. This generally results in a compensation which will not be entirely optimum.

What is claimed is:

1. A method of compensating an input digital signal having a given number of bits for magnitude truncation error which occurs when the digital signal is filtered by a digital filter, said method comprising
    sensing positive and negative portions of an input digital signal to be input to a digital filter,
    providing positive and negative signals respectively representing positive and negative values of a mean truncation error due to magnitude truncation of the signal in the filter, and
    adding said positive and negative signals respectively to the positive and negative portions of said signal which is to be input into the digital filter.

2. A method as claimed in claim 1 wherein said positive and negative signals are equal in magnitude.

3. A method as claimed in claim 1 wherein when said signal to be input to said filter has a value of zero no further signals are added thereto.

4. Apparatus for compensating an input digital signal having a given number of bits for magnitude truncation error which occurs when the digital signal is filtered by a digital filter, said apparatus comprising:
    memory means for storing positive and negative values respectively representing mean truncation errors due to magnitude truncation of a digital signal in a digital filter, said memory means having first and second outputs respectively for said positive and negative values as error signals,
    sensing means for sensing the polarity of the digital signal before input thereof to the digital filter,
    adding means having one input for the digital signal to be filtered and a second input, said adding means being connected to the digital filter, and
    switching means for selectively connecting the first and second outputs of the memory means to the second input of the adding means in accordance with the polarity of said digital signal as sensed by the sensing means.

* * * * *